(12) United States Patent
Buchwalter et al.

(10) Patent No.: US 6,924,171 B2
(45) Date of Patent: Aug. 2, 2005

(54) BILAYER WAFER-LEVEL UNDERFILL

(75) Inventors: Stephen L. Buchwalter, Hopewell Junction, NY (US); David Danovitch, Granby (CA); Fuad Elias Doany, Katonah, NY (US); Claudius Feger, Poughkeepsie, NY (US); Peter A. Gruber, Mohegan Lake, NY (US); Revathi Iyengar, Cortlandt Manor, NY (US); Nancy C. LaBianca, Yalesville, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/782,494

(22) Filed: Feb. 13, 2001

(65) Prior Publication Data

US 2002/0109228 A1 Aug. 15, 2002

(51) Int. Cl.[7] .................. H01L 21/44; H01L 21/48; H01L 21/50
(52) U.S. Cl. .................. 438/106; 438/107; 438/113; 438/114
(58) Field of Search .................. 438/106, 107, 438/113, 114, 118, 460, 612, 613, 108

(56) References Cited

U.S. PATENT DOCUMENTS

| | | | | |
|---|---|---|---|---|
| 3,943,623 A | * | 3/1976 | Mizutani et al. | 29/854 |
| 4,681,654 A | * | 7/1987 | Clementi et al. | 216/18 |
| 5,153,986 A | * | 10/1992 | Brauer et al. | 29/846 |
| 5,319,244 A | * | 6/1994 | Papathomas et al. | 257/701 |
| 5,895,229 A | * | 4/1999 | Carney et al. | 438/106 |
| 5,909,634 A | * | 6/1999 | Hotchkiss et al. | 438/612 |
| 5,930,598 A | * | 7/1999 | Wille et al. | 438/108 |
| 5,975,408 A | * | 11/1999 | Goossen | 228/173.2 |
| 6,228,678 B1 | * | 5/2001 | Gilleo et al. | 438/108 |
| 6,346,296 B1 | * | 2/2002 | McCarthy et al. | 442/66 |
| 6,372,544 B1 | * | 4/2002 | Halderman et al. | 438/108 |
| 6,410,415 B1 | * | 6/2002 | Estes et al. | 438/612 |
| 6,506,681 B2 | * | 1/2003 | Grigg et al. | 438/692 |
| 6,656,750 B1 | * | 12/2003 | Datta et al. | 438/14 |
| 6,774,493 B2 | * | 8/2004 | Capote et al. | 257/778 |
| 2002/0105092 A1 | * | 8/2002 | Coyle | |
| 2003/0199160 A1 | * | 10/2003 | Farnworth et al. | 438/613 |

* cited by examiner

*Primary Examiner*—W. David Coleman
*Assistant Examiner*—Khiem Nguyen
(74) *Attorney, Agent, or Firm*—Scully, Scott, Murphy & Presser; Daniel P. Morris, Esq.

(57) ABSTRACT

Methods for fabricating microelectronic interconnection structures as well as the structures formed by the methods are disclosed which improve the manufacturing throughput for assembling flip chip semiconductor devices. The use of a bilayer of polymeric materials applied on the wafer prior to dicing eliminates the need for dispensing and curing underfill for each semiconductor at the package level, thereby improving manufacturing throughput and reducing cost.

22 Claims, 4 Drawing Sheets

BILAYER WAFER-LEVEL UNDERFILL

This invention was made with Government support under Contract No. 1998-06-0030C awarded by NIST-ATP; therefore the Government has certain rights to the present invention.

DESCRIPTION

1. Field of the Invention

The present invention relates to microelectronic packaging, and more particularly to a microelectronic interconnect structure and to a method of fabricating the same. The inventive method which utilizes a bilayer polymeric underfill eliminates separate underfill steps that are typically required in prior art methods of fabricating microelectronic interconnect structures.

2. Background of the Invention

Flip chip technology has grown rapidly in recent years as a means of decreasing the chip footprint while simultaneously increasing the number of possible I/O's. This is because flip chip technology takes advantage of the chip area for I/O's instead of just the chip periphery as does wire bonding. Various methods exist for solder bumping wafers, such as evaporation, plating, solder paste screening and more recently, injection molding solder, i.e., IMS.

Notwithstanding how the wafers are bumped, the wafers are typically thereafter diced into separate chips. For direct chip attach, i.e., DCA, silicon chips are bonded directly to a laminate substrate. Since there is significant mismatch of CTE (coefficient of thermal expansion) between silicon and laminate materials, these chips are thereafter underfilled; Underfilling greatly increases the fatigue life of the solder bumps.

However, underfilling is associated with several manufacturing problems. First, the process is somewhat slow. This is due to the typical dispensing method of applying the liquid underfill along at least two sides of the chip and letting capillary action pull the liquid completely under the chip. Secondly, incomplete underfills may occur. Since it is difficult to determine underfill uniformity, this could lead to excess mechanical stresses on affected bumps. This, in turn, leads to shortened fatigue life for the affected chip. To avoid this problem, many flip chip packages are 100% inspected by scanning acoustic microscopy, an expensive process. Thirdly, underfilling is a packaging-processing step which must be done on each flip chip. Ideally, this step should be done on the wafer to accelerate the path from wafer to packaged chip.

In the prior art, a single-layer underfill process is typically employed. Achieving wafer-level underfill with a single-layer entails several significant problems. First, adhesion of the underfill to all surfaces including that of the chip carrier is essential for it to function as reinforcement for the solder joints, but adhesion to the chip carrier cannot be achieved if the underfill is cured on the wafer. If uncured, the underfill on the wafer must be B-staged, or partially cured, because wafer handling and dicing are incompatible with a liquid material.

Second, if the underfill is applied to a wafer already populated with solder bumps, the filler particles in the underfill will impede good wetting of the solder to the chip carrier pads. Without filler, the underfill cannot perform its function of reinforcing the solder joints because unfilled polymeric materials commonly have coefficients of thermal expansion much higher than that of solder.

Third, the solder bumps cannot be applied after the underfill is applied because then the B-staged underfill will be subjected to solder reflow temperatures during which it will liquefy and cure further.

In view of the above problems associated with prior art methods of fabricating microelectronic interconnect structures, there is a continued need for developing a new and improved method of fabricating microelectronic interconnect structures which substantially eliminates the separate underfill processes which are presently being carried out to fabricate the same. Moreover, a method is also needed that avoids the processing problems associated with single-layer wafer-level underfills.

SUMMARY OF THE INVENTION

One object of the present invention is to provide a method of fabricating a microelectronic interconnect structure that addresses the limitations of flip chip packaging with underfill applied at the package level.

A further object of the present invention is to provide a method of fabricating a microelectronic interconnect structure that is simple and easy to implement in current packaging technology.

A yet further object of the present invention is to provide a method of fabricating a microelectronic interconnect structure that avoids the processing problems associated with single-layer wafer-level underfills.

These and other objects and advantages are achieved in the present invention by employing a method wherein a bilayer wafer level underfill completely eliminates the separate underfilling process as practiced now. Thus, a time-consuming and somewhat problematic manufacturing step is removed by utilizing the method of the present invention.

Specifically, one method of the present invention comprises the steps of:

(a) forming a first polymeric material on a surface of a semiconductor wafer having interconnect pads disposed thereon;

(b) patterning said first polymeric material to provide openings that expose said interconnect pads;

(c) forming conductive bump material in said openings;

(d) forming a second polymeric material over said first polymeric material and said conductive bump material;

(e) dicing said semiconductor wafer into individual chips; and (f) bonding at least one of said individual chips to an external substrate, wherein during said bonding said conductive bump material penetrates said second polymeric material and contacts a surface of said external substrate.

A second method is also provided wherein the initial semiconductor wafer includes conductive bump material previously formed thereon. Specifically, the second method of the present invention comprises the steps of:

(a) forming a first polymeric material on a surface of a semiconductor wafer having conductive bump material disposed on portions thereof;

(b) removing a portion of said first polymeric material so as to expose top surfaces of said conductive bump material;

(c) forming a second polymeric material on said first polymeric material and said exposed top surfaces of said conductive bump material;

(d) dicing said semiconductor wafer into individual chips; and (e) bonding at least one of said individual chips to an external substrate, wherein during said bonding said conductive bump material penetrates said second polymeric material and contacts a surface of said external substrate.

Another aspect of the present invention relates to a microelectronic interconnect structure which is fabricated using the above-mentioned processing steps. Specifically, the inventive microelectronic interconnect structure comprises:

a semiconductor chip having a surface wherein conductive bump material is disposed on portions thereof;

a bilayer comprising a first polymeric material and a second polymeric material abutting said conductive bump material; and an external substrate bonded to said semiconductor chip by said conductive bump material.

DETAILED DESCRIPTION OF THE INVENTION

Figure 1A:
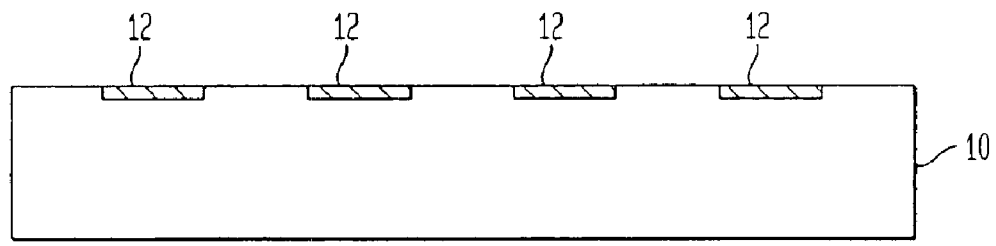
FIGS. 1A–H are cross-sectional views illustrating the inventive microelectronic interconnect structure through various processing steps of the present invention.

The present invention which provides a microelectronic interconnect structure and a method of fabricating the same will now be described in more detail by referring to the drawings that accompany the present application. It is noted that in these drawings, like and/or corresponding elements are referred to by like reference numerals.

Reference is first made to FIG. 1A which illustrates an initial structure that can be employed in the present invention. Specifically, the initial structure shown in FIG. 1A comprises semiconductor wafer 10 having interconnect pads 12 formed on predetermined portions of the wafer. The structure shown in FIG. 1A is comprised of conventional materials well known to those skilled in the art and conventional processing steps are used in fabricating the same.

For example, semiconductor wafer 10 is comprised of a semiconducting material including, but not limited to: Si, Ge, SiGe, GaAs, InAs, InP and all other II/V compound semiconductors. The wafer may also be composed of a layered semiconductor such as Si/SiGe, Si/Si or silicon-on-insulators (SOIs). The wafer includes various semiconductor devices (not shown in the drawings) that are formed within or on the wafer. Illustrative examples of some types of devices that may be present include, but are not limited to: transistors, capacitors, memory cells, drivers, I/O circuitry, charge pumps and other like devices. The wafer may include any combination of the aforementioned devices.

The wafer is fabricated using conventional processes well known to those skilled in the art which may vary depending on the types of devices present therein. For example, conventional complementary metal oxide semiconductor (CMOS) processing steps may be used in forming the transistors and back-end-of-the-line (BEOL) processes may be used in forming the interconnect pads on the surface of the wafer. Although not depicted in the drawings, the wafer contains the appropriate ball-limiting metallurgy (BLM) covering the pads which will receive the conductive bump material.

Figure 1B:
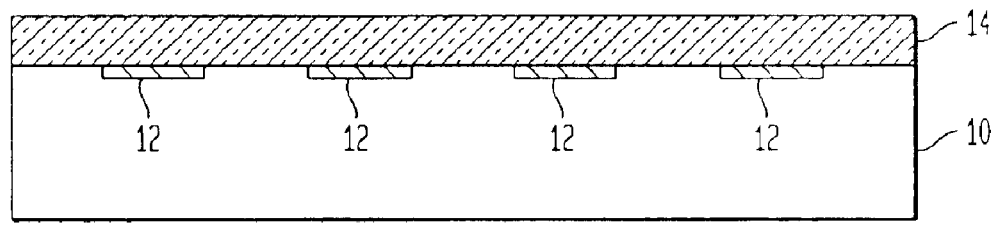

FIG. 1B shows a structure after application of first polymeric material 14 to the wafer front side containing the interconnect pads. The first polymeric material is formed using conventional deposition processes well known to those skilled in the art including: spin coating, dip coating, brushing, chemical vapor deposition (CVD), plasma-assisted CVD, sputtering, chemical solution deposition and other like deposition processes. Of these various deposition processes, it is preferred to form the first polymeric layer by spin coating. When spin coating is employed, the first polymeric material may be hot baked and cured using conventional conditions prior to proceeding to the next step of the present invention. Alternatively, the first polymeric material may be patterned before the final cure utilizing conventional processes well known in the art.

The first polymeric material employed in the present invention is composed of a dielectric passivating material such as polyimides, polyamides, Si-containing polymers, parylene polymers, polybenzocyclobutane, epoxies and other like dielectric passivating materials. Of these various passivating polymeric materials, it is preferred that first polymeric material 14 be composed of polyimides or an epoxy. The thickness of the first polymeric material may vary, however, it should be thicker than the current passivation layers that are employed in the prior art. Typically, the first polymeric material has a final thickness of from about 25 to about 100 microns.

In one embodiment of the present invention, the first polymeric material may optionally include an inorganic filler therein which substantially reduces the thermal coefficient of expansion of the material. Examples of inorganic fillers that may be present in the first polymeric material include: silica, fumed silica, alumina, titanium dioxide, glass fibers and other like inorganic fillers. Mixtures of these inorganic fillers are also contemplated herein. When present, the inorganic fillers are typically present in said first polymeric material in an amount of from about 10 to about 80 wt. %, with an amount of from about 50 to about 70 wt. % being more highly preferred.

Figure 1C:
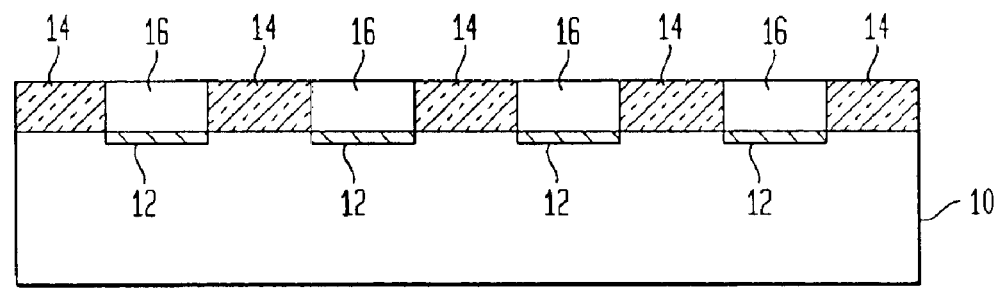

After application of first polymeric material 14 to wafer 10 and pads 12, the structure shown in FIG. 1B is subjected to any conventional patterning process such as laser etching or lithography and etching which forms openings 16 in the structure that expose pads 12. The patterned structure is shown, for example, in FIG. 1C. The lithography step employed in forming the structure illustrated in FIG. 1C includes application of a photoresist, exposing the photoresist to a pattern of radiation and developing the pattern using a conventional resist developer. The etching step which forms the openings in the first polymeric material that expose the underlying interconnect pads includes dry etching processes such as laser ablation, reactive-ion etching (RIE), plasma etching, and ion beam etching as well as wet etching using a chemical etchant that has a high selectivity to the polymeric material.

Figure 1D:
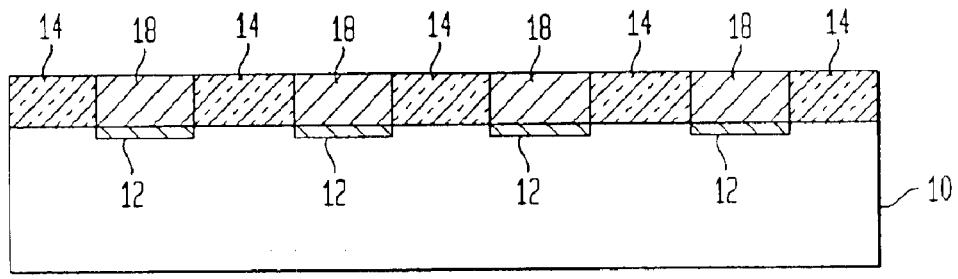

It is noted that the patterned first polymeric material is employed in the present invention as a mask for forming conductive bump material in the openings. FIG. 1D shows a structure wherein conductive bump material 18 is formed on exposed surfaces of pads 12 using said patterned first polymeric material as a mask.

The conductive bump material that is employed in the present invention includes conventional conductive materials which are capable of forming a bond to the underlying pads. Examples of such conductive bump materials, include, but are not limited to: Sn—Ag, Sn—Ag—Cu, and other lead-free solders such as Sn—Ag—Bi and conventional solders such as Sn—Pb, and other like materials. A highly preferred conductive bump material employed in the present invention is Sn—Pb solder.

The conductive bump material may be applied in the openings using conventional techniques that are well known to those skilled in the art. For example, an injection molded solder (IMS) process, which scans a head containing molten solder over the wafer and fills the cavities, may be employed in the present invention. After filling the openings with solder, the wafer is cooled and the solder solidifies. In effect, the first polymeric material also serves as the major portion of the underfill as will be seen in the drawings to follow. In addition to IMS, the present invention also contemplates the use of evaporation, plating and paste screening as means for forming conductive bump material 18 on pads 12.

Figure 1E:
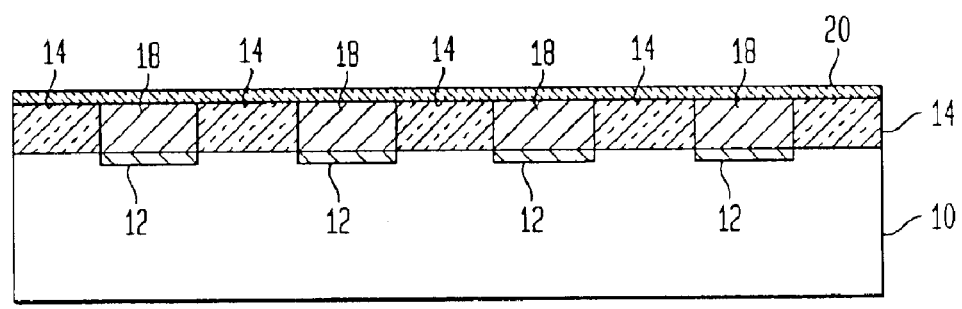

Next, a thin layer of second polymeric material 20 is applied uniformly over the wafer including first polymeric material 14 and conductive bumps 18, See FIG. 1E. The second polymeric material, which includes a flux material and an adhesive, is applied using one of the above mentioned deposition processes that are used in forming the first polymeric material. For example, a spin coating or similar process may be used. Although the thickness of the second polymeric material may vary, the second polymeric material should have a thickness that is less than the first polymeric material. Typically, in the present invention, the second polymeric material has a thickness of from about 1 to about 10 micron.

In accordance with the present invention, conventional materials which include both a flux material and an adhesive material are employed as the second polymeric material. Some illustrative examples of the second polymeric material that may be employed in the present invention include, but are not limited to: thermoplastics, thermosets such as epoxies and polyimides, and other adhesives. Of these materials, it is preferred to use epoxies as the second polymeric material.

Following application of the second polymeric material, the structure is partially cured so as to harden the second polymeric material. This curing step may be carried out using conditions that are capable of hardening the second polymeric material into a partially cured state (B-stage).

Figure 1F:
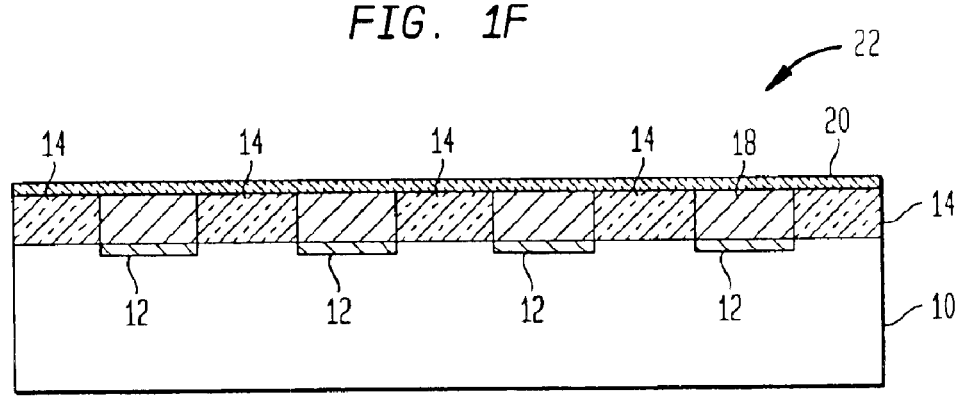
Figure 1G:
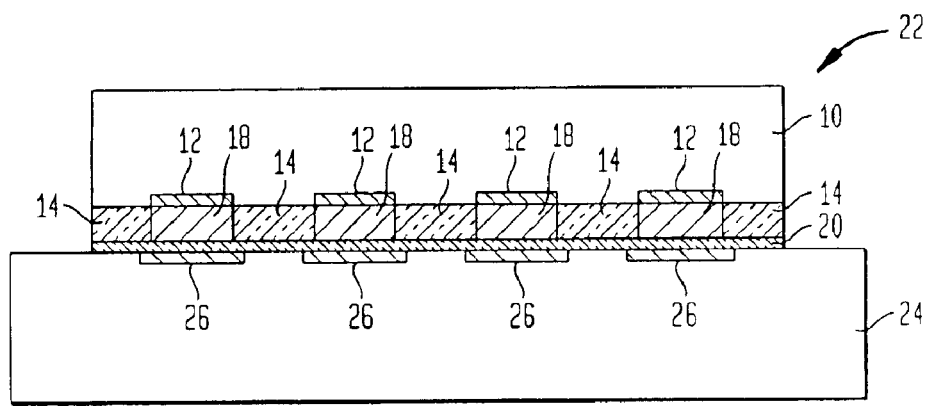

Following the application and partial curing of the second polymeric material, the wafer is ready to be diced by conventional means into individual chips. FIG. 1F shows diced chip 22 containing in effect everything required to bond and underfill it to an external substrate such as a laminate substrate. FIG. 1G shows the flipped chip being aligned and placed on external substrate 24. External substrate 24 which includes receiving pads 26 is composed of a conventional substrate such as a laminate substrate, a chip carrier, a printed circuit card or board. As shown, the conductive bump filled openings align to the receiving pads on the external substrate.

Next, the diced chip is bonded to the external substrate using any well known bonding process which is capable of heating the conductive bump material to its reflow temperature. Typically, in the present invention, bonding occurs at a temperature of from about 180° to about 260° C. for a time period of from about 1 to about 10 minutes.

In accordance with the present invention, this heating step serves the following two functions: First, it activates the fluxing agent in the second polymeric material thus allowing the conductive bump material to penetrate through it and wet (metallurgically bond) to the pad on the external substrate. Secondly, it activates the adhesive in the second polymeric material which mechanically bonds the chip to the external substrate. Since the second polymeric layer is thin (typically below 10 microns) compared to the first polymeric material which serves as the conductive bump mask, there is very little conductive bump volume needed to penetrate through it. Also, during this heating step, the second polymeric material thins still further as it bonds to the external substrate. Thus most of the conductive bump volume stays within the openings and is surrounded by the walls of each opening. The net result is the same as for conventional underfills, i.e., solder joints are completely surrounded and reinforced by the underfill.

Figure 1H:
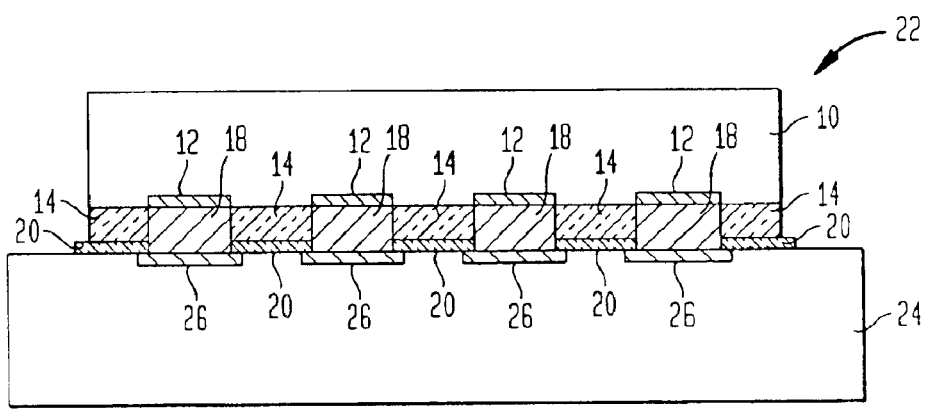

It is noted that FIG. 1H shows the inventive interconnect structure of the present invention. As is shown, the inventive structure comprises chip 22 bonded to external substrate 24 through conductive bump material 18. The conductive bump material is surrounded by a bilayer that comprises first polymeric material 14 and second polymeric material 20.

Figure 2A:
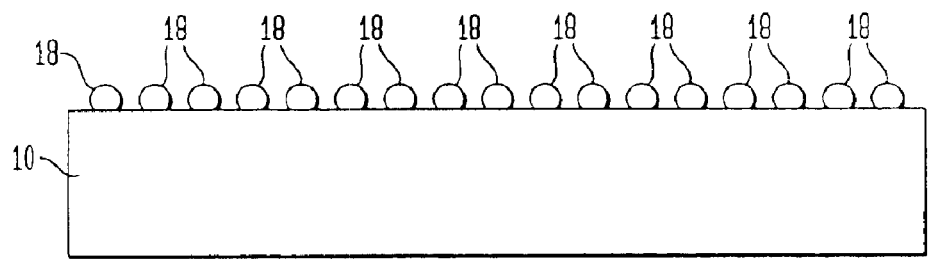
FIGS. 2A–D are cross-sectional views illustrating the inventive microelectronic interconnect structure through alternative processing steps of the present invention.
Figure 2B:
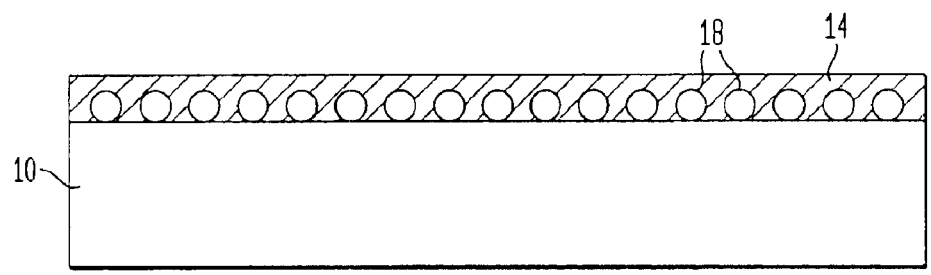
Figure 2C:
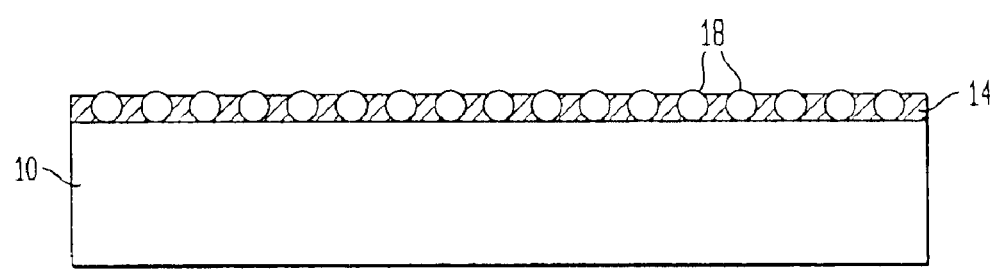
Figure 2D:
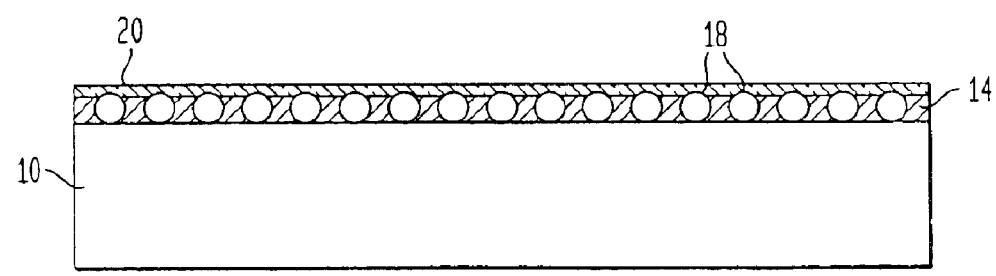

As an alternative embodiment of the present invention, the order of application of conductive bumps 18 and first polymeric material 14 can be reversed. This alternative embodiment of the present invention is shown, for example, in FIGS. 2A–D. Specifically, FIG. 2A shows semiconductor wafer 10 having conductive bump material 18 formed on predetermined portions of the wafer that include interconnect pads. The interconnect pads are not shown in these drawings, but nevertheless are present on the surface of wafer 10. FIG. 2B shows a structure which includes first polymeric material 14 formed on the bumped wafer. Note that the thickness of the first polymeric material, in this embodiment, should be sufficient to at least cover every bump present on the wafer. The first polymeric material is then thinned by utilizing a conventional polishing process such as chemical-mechanical polishing (CMP) or etching to expose a top surface of every bump, See FIG. 2C. A thin layer of second polymeric material 20 is then applied on the thinned structure of FIG. 2C to cover every bump; See FIG. 2D, and partially cured. At this point of the alternative embodiment of the present invention, the wafer is ready for dicing into chips which can be flip chip bonded to the external substrate. Specifically, the structure shown in FIG. 2D is then subjected to the processes that are described above in forming the structures shown in FIGS. 1F–H.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim is new and desire to secure by the Letters Patent is:

1. A method of forming a microelectronic interconnect structure containing a bilayer underfill layer comprising the steps of:

(a) forming a first polymeric on a surface of a semiconductor wafer having interconnect pads disposed thereon;

(b) patterning said first polymeric material to provide openings that expose said interconnect pads;

(c) forming conductive bump material in said openings;

(d) forming a second polymeric material that is partially cured to a B-stage state atop said first polymeric material and said conductive bump material;

(e) dicing said semiconductor wafer into individual chips; and (f) bonding at least one of said individual chips to an external substrate, wherein during said bonding said conductive bump material penetrates said second polymeric material and contacts a surface of said external substrate.

2. The method of claim 1 wherein said first polymeric material is formed by a deposition process selected from the group consisting of spin coating, dip coating, brushing, chemical vapor deposition (CYD) plasma-assisted CVD, sputtering, and chemical solution deposition.

3. The method of claim 2 wherein said deposition process is spin coating.

4. The method of claim 1 wherein said first polymeric material is a dielectric polymeric material selected from the group consisting of polyimides, polyamides, Si-containing polymers, parylene polymers, polybenzocyclobutane and epoxies.

5. The method of claim 4 wherein said first polymeric material is an epoxy.

6. The method of claim 1 wherein said first polymeric material further includes an inorganic filler.

7. The method of claim 6 wherein said inorganic filler is silica, fumed silica, alumina, titanium dioxide, glass fibers or mixtures thereof.

8. The method of claim 6 wherein said inorganic filler is present in said first polymeric material in an amount of from about 10 to about 80 wt. %.

9. The method of claim 1 wherein said first polymeric material has a thickness of from about 25 to about 100 microns.

10. The method of claim 1 wherein said wafer is composed of a semiconducting material and has one or more devices present therein.

11. The method of claim 1 wherein step (b) includes lithography and etching.

12. The method of claim 1 wherein said conductive bump material is solder.

13. The method of claim 1 wherein said conductive bump material is applied to said openings by injection molding, evaporation, plating, or a paste screening process.

14. The method of claim 1 wherein said second polymeric material is formed by spin coating.

15. The method of claim 1 wherein said second polymeric material includes a fluxing agent and an adhesive.

16. The method of claim 1 wherein said second polymeric material is a thermoplastic or thermosetting adhesive.

17. The method of claim 1 wherein said second polymeric material has a thickness that is thinner than said first polymeric material.

18. The method of claim 1 wherein said second polymeric material has a thickness of from about 1 to about 10 microns.

19. The method of claim 1 wherein said bonding step occurs a temperature of from about 180° to about 260° C. for a time period of from about 1 to about 10 minutes.

20. The method of claim 1 wherein said external substrate is a laminate substrate, a chip carrier, a circuit card or a circuit board, each having interconnect pads formed thereon.

21. A method of forming a microelectronic interconnect structure containing a bilayer underfill layer comprising the steps of:

(a) forming a first polymeric material on a surface of a semiconductor wafer having conductive bump material disposed on portions thereof;

(b) removing a portion of said first polymeric material so as to expose top surfaces of said conductive bump material;

(c) forming a second polymeric material on said first polymeric material and said exposed top surfaces of said conductive bump material;

(d) dicing said semiconductor wafer into individual chips; and (e) bonding at least one of said individual chips to an external substrate, wherein during said bonding said conductive bump material penetrates said second polymeric material and contacts a surface of said external substrate.

22. The method of claim 21 wherein step (b) is carried out by polishing or etching.

* * * * *

UNITED STATES PATENT AND TRADEMARK OFFICE
CERTIFICATE OF CORRECTION

PATENT NO. : 6,924,171 B2
DATED : August 2, 2005
INVENTOR(S) : Stephen L. Buchwalter et al.

It is certified that error appears in the above-identified patent and that said Letters Patent is hereby corrected as shown below:

Column 3,
Line 42, "and all other II/V" should read -- and all other III/V --.

Column 7,
Line 4, "vapor deposition (CYD)" should read -- vapor deposition (CVD) --.

Signed and Sealed this

Fourth Day of October, 2005

JON W. DUDAS
*Director of the United States Patent and Trademark Office*